US009278318B2

(12) United States Patent
Anderson et al.

(10) Patent No.: US 9,278,318 B2
(45) Date of Patent: Mar. 8, 2016

(54) GRAPHENE NANOTUBE ARRAY FOR GAS FILTRATION

(71) Applicant: Empire Technology Development LLC, Wilmington, DE (US)

(72) Inventors: Kraig Anderson, Burlingame, CA (US); Angele Sjong, Louisville, CO (US)

(73) Assignee: Empire Technology Development LLC, Wilmington, DE (US)

( * ) Notice: Subject to any disclaimer, the term of this patent is extended or adjusted under 35 U.S.C. 154(b) by 251 days.

(21) Appl. No.: 13/995,339

(22) PCT Filed: Dec. 4, 2012

(86) PCT No.: PCT/US2012/067781
§ 371 (c)(1),
(2) Date: Jun. 18, 2013

(87) PCT Pub. No.: WO2014/088556
PCT Pub. Date: Jun. 12, 2014

(65) Prior Publication Data
US 2014/0183133 A1    Jul. 3, 2014

(51) Int. Cl.
*B01D 53/22* (2006.01)
*B01D 63/02* (2006.01)
(Continued)

(52) U.S. Cl.
CPC ............ *B01D 71/021* (2013.01); *B01D 53/228* (2013.01); *B01D 61/027* (2013.01);
(Continued)

(58) Field of Classification Search
CPC ...... B01D 69/02; B01D 69/12; B01D 69/125; B01D 69/122; B01D 69/141; B01D 69/148; B01D 71/76; B01D 2325/02; B01D 53/22; B01D 53/228; C01B 31/02; C01B 31/022; C01B 31/04; C01B 31/0438; C01B 31/0446; C01B 2202/02; C01B 2202/08; C01B 2202/20; C01B 2202/26; C01B 2202/34; C01B 2202/36; Y10S 977/742; Y10S 977/743; Y10S 977/75; Y10S 977/753; Y10S 977/848; Y10S 977/842
See application file for complete search history.

(56) References Cited

U.S. PATENT DOCUMENTS 7,931,838 B2   4/2011  Marand et al.
8,154,093 B2   4/2012  Bradley et al.
(Continued)

FOREIGN PATENT DOCUMENTS

JP  2005007861 A1   1/2005
KR  20060112519 A1  11/2006
(Continued)

OTHER PUBLICATIONS

Machine translation of KR 10-0775412 (registration number corresponding to publication KR 2007-0104810), first published Oct. 29, 2007.*
(Continued)

*Primary Examiner* — Katherine Zalasky
(74) *Attorney, Agent, or Firm* — Turk IP Law, LLC

(57) ABSTRACT

Technologies are generally described for a gas filtration device including an array of parallel carbon nanotubes. The carbon nanotubes may extend between first and second substrates, and the ends of the carbon nanotubes may be embedded in the substrates and cut to expose openings at each end of the carbon nanotubes. The carbon nanotubes may be composed from a graphene membrane which may be perforated with a plurality of discrete pores of a selected size for enabling one or more molecules to pass through the pores. A fluid mixture including two or more molecules for filtering may be directed through the first openings of the array of nanotubes, and the fluid mixture may be filtered by enabling smaller molecules to pass through the discrete pores of the graphene membrane walls of the carbon nanotubes to produce in a filtrate fraction including the smaller molecules and a retentate fraction including larger molecules.

20 Claims, 8 Drawing Sheets

(51) Int. Cl.
  B01D 71/02 (2006.01)
  B01D 61/02 (2006.01)
  H01J 37/34 (2006.01)
  C01B 31/02 (2006.01)
(52) U.S. Cl.
  CPC ........... *B01D63/022* (2013.01); *H01J 37/3405* (2013.01); *B01D 2323/50* (2013.01); *C01B 31/022* (2013.01)

(56) References Cited

U.S. PATENT DOCUMENTS

| | | | |
|---|---|---|---|
| 2006/0017191 A1 | 1/2006 | Liang et al. | |
| 2006/0283262 A1 | 12/2006 | Smits et al. | |
| 2008/0271606 A1* | 11/2008 | Holmes et al. | 96/132 |
| 2010/0213419 A1 | 8/2010 | Jiang et al. | |
| 2011/0163636 A1 | 7/2011 | Sirbuly et al. | |
| 2011/0253630 A1 | 10/2011 | Bakajin et al. | |
| 2012/0255899 A1 | 10/2012 | Choi et al. | |

FOREIGN PATENT DOCUMENTS

| | | |
|---|---|---|
| KR | 20070104810 A1 | 10/2007 |
| WO | 2012128763 A1 | 9/2012 |

OTHER PUBLICATIONS

Bucior et al. Porous carbon nanotube membranes for separation of H2/CH4 and CO2/CH4 mixtures. J. Phys. Chem. C, 116 (2012) 25904-25910.*

International Search Report and Written Opinion for PCT/US12/67781 filed Dec. 4, 2012, mailed on Feb. 11, 2013.

Wang et al., "Fabrication of ultralong and Electrically Uniform Single-Walled Carbon Nanotubes on Clean Substrates", Nano Letters, Jun. 2009.

Mi et al., "Vertically aligned carbon nanolube membranes macroporous alumina supports", Journal of Membrane Science, vol. 304, pp. 1-7, May 2007.

Kim et al., "Scalable Fabrication of Carbon Nanotube/Polymer Nanocomposite Membranes for high Flux Gas Transport", Nano Letters, 7(9), pp. 2806-2811, Jul. 2007.

Tseng et al., "Preparation and characterization of carbon molecular sieve membranes for gas separation—the effect of incorporated multi-wall carbon nanotubes", Desalination 240, pp. 40-45, Presented in Sep. 2007 at the Third Membrane Science and Technology Conference of Visegrad Countries (PERMEA), accepted Jan. 2008.

Oyama et al., "Theory of hydrogen permeability in nonporous silica membranes", J Membrane Science, 244, pp. 45-53, Nov. 2004.

Jiang et al., "Porous Graphene as the Ultimate Membrane for Gas Separation", Nano Letters, pp. 4019-4024, Sep. 2009.

Schrier, "Helium Separation Using Porous Graphene Membranes", J. Phys. Chem. Lett., pp. 2284-2287, Jul. 2010.

Majumder et al., "Mass Transport through Carbon Nanotube Membranes in Three Different Regimes: Ionic Diffusion and Gas and Liquid Flow", ACS Nano. pp. 3867-3877, Apr. 2011.

Joselevich et al., "Carbon Nanotube Synthesis and Organization", Topics Appl. Physics, pp. 101-164, Dec. 2007.

Ma et al., "Large-diameter and water-dispersible single-walled carbon nanotubes: synthesis characterization and applications", J Mater Chem., pp. 3033-3041, Mar. 2009.

Iwasaki et al., "Mechanism Analysis of Interrupted Growth of Single-Walled Carbon Nanotube Arrays", Nano Letters, pp. 886-890, Jan. 2008.

Hasegawa et al., "Millimeter-Tall Single-walled Carbon Nanotubes Rapidly Grown with and without Water", ACS Nano, pp. 975-984, Jan. 2011.

Lee et al., "Low Temperature Growth of Single-walled Carbon Nanotube Forest", Bull. Korean Chem. Soc., pp. 2819-2822, Aug. 2010.

Misra et al, "Synthesis and Characterization of Carbon Nanotube-Polymer Multilayer Structures", ACS Nano, pp. 7713-7721, Sep. 2011.

Hinds et al., "Aligned Multiwalled Carbon Nanotube Membranes", Science, pp. 62-65, Jan. 2004.

Garcia et al., "Fabrication of Composite Microstructures by Capillary-driven Wetting of aligned Carbon Nanotubes with Polymers", Nanotechnology, Mar. 2007.

Manufacturing Ultra-Tall Carbon Nanotube Forests, accessed at https://web.archive.org/web/20121010162329/http://www.lanl.gov/orgs/tt/license/technologies/index.php?fuseaction=home.viewTechnology&id=766, posted on Jul. 11, 2006, p. 1.

* cited by examiner

GRAPHENE NANOTUBE ARRAY FOR GAS FILTRATION

This Application is the U.S. National Stage filing under 35 U.S.C. §371 of PCT Application Ser. No. PCT/US2012/67781 filed on Dec. 4, 2012.

BACKGROUND

Unless otherwise indicated herein, the materials described in this section are not prior art to the claims in this application and are not admitted to be prior art by inclusion in this section.

Porous graphene is considered to be a desirable membrane for gas separation. Theoretical and experimental studies indicate that atom-scale holes in the graphene lattice may provide significant selectivity for separating gases based on molecular size. Further, monolayer graphene, at one atom thick, is a desirable candidate because the gas permeation rate through a membrane increases with decreasing membrane thickness.

Consequently, porous graphene membranes are being pursued for their potential to significantly outperform conventional polymeric membranes, e.g., in separating gases that are synthesized at high temperatures. For example, the "shift reaction" used to create hydrogen gas from water and carbon dioxide may run at temperatures over 400° C. Since there is currently no membrane that effectively purifies hydrogen in a single step, much less at such high temperatures, current hydrogen purification may include capital and energy intensive steps such as cooling, as well as removal of water, carbon dioxide, and other impurities.

A graphene membrane with uniformly sized pores may effectively purify hydrogen from the "shift reaction" in a single step. However, current graphene membranes having uniformly sized pores have a low membrane throughput and may be inefficient for separation when used in a two-dimensional or flat configuration. Some factors affecting the membrane throughput and efficiency of the flat graphene membranes include low probability of successful trajectory for enabling the molecule to align with and pass through a pore, a low pore area percentage, e.g. a low pore to membrane ratio, and a low gas adsorption to graphene. Some known nanofiltration methods have used porous graphene in cylindrical form for increasing the membrane throughput.

SUMMARY

The present disclosure generally describes compositions, methods, apparatus, systems, devices, and/or computer program products related to manufacturing or using carbon nanotubes in a gas filtration device.

According to some example embodiments, the present disclosure describes a filtering device. The filtering device may include a first substrate, a second substrate, and an array of nanotubes having porous walls selective for the passage of one or more molecules across the porous walls, the array of nanotubes extending between the first substrate and the second substrate, each nanotube having a first opening embedded in the first substrate and a second opening embedded in the second substrate such that a fluid mixture comprising at least a first molecule and a second molecule may be provided into one of the first or the second openings and one of the first and second molecules may be filtered through the porous walls.

According to other example embodiments, the present disclosure also describes a method of forming a filtering device with an array of nanotubes. The method may include growing an array of nanotubes, embedding a first end of the array of nanotubes in a first substrate, embedding a second end of the array of nanotubes in a second substrate such that an inner surface of the first substrate faces an inner surface of the second substrate to define a gap between the inner surfaces, wherein the gap may be crossed by the array of nanotubes, preparing an outer surface of the first substrate such that each nanotube in the array of nanotubes includes a first opening at the outer surface of the first substrate, preparing an outer surface of the second substrate such that each nanotube in the array of nanotubes includes a second opening at the outer surface of the second substrate, such that the outer surfaces of the first substrate and the second substrate may be in fluid communication through each of the nanotubes, forming a plurality of pores in each nanotube of the array of nanotubes, and coupling one or more walls to the first substrate and the second substrate, such that fluid communication between the outer surfaces of the first and second substrates may be controlled through the array of nanotubes, such that fluid communication between the outer surfaces and the gap between the inner surfaces may be controlled by the plurality of pores in the nanotubes.

According to further example embodiments, the present disclosure also describes system for forming a filtering device with parallel nanotubes. The system may include a nanotube growth chamber, a sample manipulator configured to hold a growth substrate in the nanotube growth chamber, a catalyst depositor configured to deposit a nanoparticulate catalyst, a gas source configured to deliver gas to the nanotube growth chamber, a heater configured to heat the nanotube growth chamber, a monomer source operatively coupled to the sample manipulator, a polymerization initiator, a microtome, a pore forming apparatus, and a controller configured by machine executable instructions, the controller coupled with the nanotube growth chamber, the sample manipulator, the catalyst depositor, the gas source, the heater, the monomer source, the polymerization initiator, the microtome, and the pore forming apparatus. The controller may be operable to configure the sample manipulator to hold the growth substrate, configure the catalyst depositor to deposit a nanoparticulate catalyst on the growth substrate, configure the gas source to expose a nanotube feedstock gas to the nanoparticulate catalyst deposited on the growth substrate, configure the heater to heat the nanotube growth chamber such that an array of nanotubes grows from the nanoparticulate catalyst deposited on the growth substrate, configure the monomer source to independently embed a first end and a second end of the array of nanotubes in a monomer, configure the polymerization initiator to polymerize the monomer to form a first substrate at the first end of the array of nanotubes and a second substrate at the second end of the array of nanotubes, configure the sample manipulator to remove the growth substrate, configure the microtome to cut the polymerized monomer that forms the first substrate and the second substrate such a first opening of each nanotube may be exposed at an outer surface of the first substrate and a second opening of each nanotube may be exposed at an outer surface of the second substrate, and configure the pore forming apparatus to form a plurality of pores in each nanotube in the array of nanotubes.

According to yet other example embodiments, the present disclosure may also include a method of filtering a fluid mixture. The method may include exposing the fluid mixture to a first end of an array of nanotubes embedded in a first substrate, wherein the fluid mixture comprises at least a first molecular species and a second molecular species, directing the first molecular species through a plurality of pores located in each nanotube in the array of nanotubes to form a filtrate fraction that includes at least a portion of the first molecular species, collecting the filtrate fraction that includes the first molecular species, retaining the second molecular species within the array of nanotubes to form a retentate fraction that includes at least a portion of the second molecular species, and collecting the retentate fraction at a second end of the array of nanotubes embedded in a second substrate.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

The foregoing and other features of this disclosure will become more fully apparent from the following description and appended claims, taken in conjunction with the accompanying drawings. Understanding that these drawings depict only several embodiments in accordance with the disclosure and are, therefore, not to be considered limiting of its scope, the disclosure will be described with additional specificity and detail through use of the accompanying drawings, in which:

DETAILED DESCRIPTION

Figure 1:
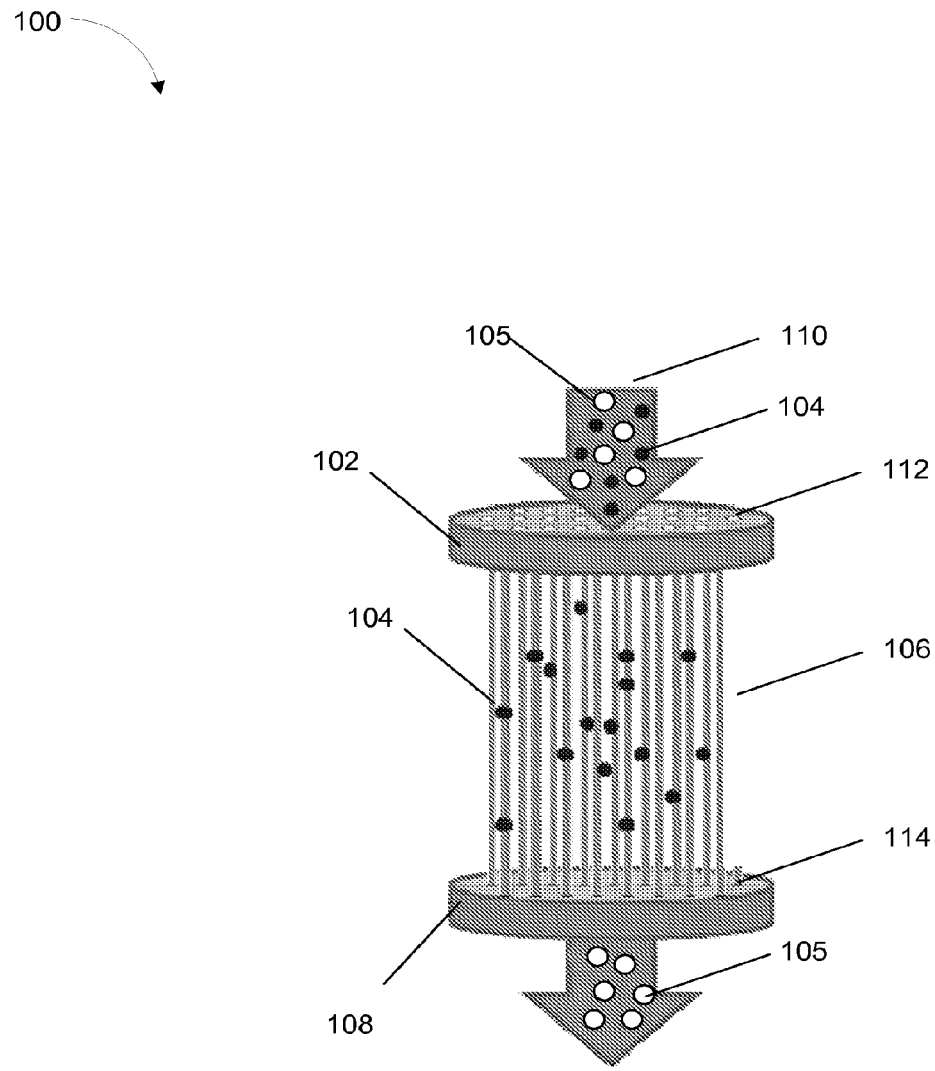
FIG. 1 illustrates an example gas filtration device, including a plurality of parallel carbon nanotubes.

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein, and illustrated in the Figures, can be arranged, substituted, combined, separated, and designed in a wide variety of different configurations, all of which are explicitly contemplated herein.

This disclosure is generally drawn, inter alia, to methods, apparatus, systems, devices, and/or computer program products related to providing an array of parallel carbon nanotubes for filtering a gas mixture.

Briefly stated, technologies are generally described for a gas filtration device including an array of parallel carbon nanotubes. The carbon nanotubes may extend between first and second substrates, and the ends of the carbon nanotubes may be embedded in the substrates and cut to expose openings at each end of the carbon nanotubes. The carbon nanotubes may be composed from a graphene membrane which may be perforated with a plurality of discrete pores of a selected size for enabling one or more molecules to pass through the pores. A fluid mixture including two or more molecules for filtering may be directed through the first openings of the array of nanotubes, and the fluid mixture may be filtered by enabling smaller molecules to pass through the discrete pores of the graphene membrane walls of the carbon nanotubes to produce in a filtrate fraction including the smaller molecules and a retentate fraction including larger molecules.

The following definitions are intended to be general definitions for helping the reader understand the disclosure. Any meanings implied throughout the specification are not intended to be limiting, but are intended to be example non-literal definitions for describing some example embodiments.

As used herein, "graphene" may mean a planar allotrope of carbon characterized by a hexagonal lattice of carbon atoms that may be connected by aromatic carbon-carbon bonds. As used herein, a graphene "monolayer" may be a one-carbon atom thick layer of graphene. In some examples, the graphene monolayer may include some nonaromatic carbons, e.g., some carbons may be passivated with hydrogen and may be bonded to other carbons by nonaromatic single carbon-carbon bonds. As used herein, a "perforated graphene monolayer" may mean a graphene monolayer that may include a plurality of discrete pores through the graphene monolayer. The discrete pores may pass entirely through the graphene monolayer. The discrete pores may permit selective passage of atomic or molecular species from one side of the graphene monolayer to the other side of the graphene monolayer. As used herein, a "chemically perforated" pore in the graphene may be characteristic of preparation by selective removal of one or more carbon atoms from the graphene lattice, for example, atomic or molecular species may be reacted with the graphene in a process which results in selective removal of one or more carbon atoms from the graphene lattice.

As used herein, "discrete" pores in a graphene monolayer may be distinct from each other by at least one intervening carbon-carbon bond, or in some examples, at least one intervening six-membered graphene ring. For example, two discrete pores may be separated from each other by at least one intervening six-membered graphene ring or at least one intervening carbon-carbon bond.

As used herein, a "carbon vacancy defect" may be a pore in a graphene monolayer which may be defined by the absence of one or more carbon atoms compared to a graphene monolayer without a carbon vacancy defect. As used herein, the "number" of carbon vacancy defects in reference to "substantially the same number of one or more carbon vacancy defects" may mean about one or more carbon defects, or in some examples about two or more carbon defects. In various examples, the number of carbon vacancy defects may be between about one and about ten defects, for example, about: one, two, three, four, five, six, seven, eight, nine, or ten defects.

As used herein, a "substantially uniform pore size" may mean that the discrete pores may be characterized by substantially the same number of one or more carbon vacancy defects per discrete pore. In various examples, discrete pores of substantially uniform pore size may have their carbon vacancy defects arranged in substantially the same relative lattice positions within each discrete pore. For example, a plurality of substantially uniform pores that include six carbon vacancy defects each may correspond to removal of a six membered ring of carbon atoms in the hexagonal graphene lattice. In another example, a plurality of substantially uniform pores that include six carbon vacancy defects each may correspond to removal of a six membered staggered linear chain of carbon atoms in the hexagonal graphene lattice.

As used herein, "substantially uniform pore sizes throughout" may mean that at least about 80% of the discrete pores in a perforated graphene monolayer may have a substantially uniform pore size. In various examples, the percentage of discrete pores in a perforated graphene monolayer that may have a substantially uniform pore size may be: about 85%, about 90%, about 95%, about 96%, about 97%, about 98%, about 99%, about 99.5%, or about 99.9%. In some examples, all of the discrete pores in a perforated graphene monolayer may have a substantially uniform pore size.

As used herein, "substantially the same number of one or more carbon vacancy defects" in relation to the plurality of discrete pores may mean that such discrete pores differ from each other by at most about three carbon vacancy defects. For example, a plurality of pores having substantially the same number of one or more carbon vacancy defects may range between one and three carbon vacancy defects per pore. In various examples, discrete pores may vary in number of carbon vacancy defects by about three, about two, or about one. In some examples, each of the plurality of discrete pores has the same number of carbon vacancy defects.

As used herein, "separation efficiency" may mean a ratio of perforated graphene membrane permeability rates between specific pairs of atomic or molecular species. For example, the perforated graphene monolayer as described below in conjunction with FIG. 1 and FIG. 2 may be characterized by a hydrogen/methane separation efficiency, which may be a ratio of permeation rates of molecular hydrogen ($H_2$) compared to methane ($CH_4$). In some examples, the hydrogen/methane separation efficiency may be at least about 200:1; or in various examples, between about 200:1 and about $10^{23}$:1, for example, at least about: $10^3$:1; $10^4$:1; $10^5$:1; $10^6$:1; $10^9$:1; $10^{12}$:1; $10^{15}$:1; $10^{18}$:1; or $10^{21}$:1. Some example separation efficiency theoretical calculations for a one-atom thick graphene membrane characterized by pores 2.5 Angstroms in diameter provide that the ratio of a calculated hydrogen permeability rate divided by a calculated methane permeability rate is $10^{23}$:1. In comparison, currently known "solution diffusion" polymer membranes have a hydrogen to methane separation efficiency of about 150:1.

As used herein, a "permeable substrate," may be any material that may be employed to provide support to a perforated graphene monolayer. As used herein, a "permeable substrate" may also be permeable to at least one atomic or molecular species that traverses discrete pores in the perforated graphene monolayer. Suitable substrates may include "solution-diffusion" solid membranes that permit atomic or molecular species to diffuse through the solid material of the permeable substrate. Suitable permeable substrates may also be configured as porous membranes or filters having pores, voids, channels, or the like, through which atomic or molecular species may travel. Suitable materials for the substrate may include, for example, one or more of polyethylene, polypropylene, polyester, polyurethane, polystyrene, polyolefin, polysulfone and/or polyethersulfone. In various examples, suitable materials for the permeable substrate may be characterized by a minimum molecular weight cutoff from: about 1,000 Daltons to about 1,000,000 Daltons; about 5,000 Daltons to about 1,000,000 Daltons; about 25,000 Daltons to about 500,000 Daltons; about 50,000 Daltons to about 250,000 Daltons; or about 100,000 Daltons. In some examples, a suitable permeable substrate may include a polyether sulfone membrane characterized by a maximum molecular weight cutoff of about 100,000 Daltons.

As used herein, a "fluid mixture" may be any fluid phase, e.g., gas phase, liquid phase, or supercritical phase, which may include at least a first molecular species and a second molecular species. In various examples, the fluid mixture may include: a mixture of gases; a mixture of a vapor in a gas; a mixture of liquids; a solution of a gas dissolved in a liquid; a solution of a solid dissolved in a liquid; a solution of a gas, liquid or solid in a supercritical fluid; or the like. In some examples, the fluid mixture may be in contact with other phases of the two or more different molecules. For example, a fluid mixture that includes fluid phase carbon dioxide as one of the molecules may be in contact with solid phase carbon dioxide.

The first and second molecules may include compounds consisting of a single atom, for example, helium, neon, argon, krypton, xenon, and radon. The molecules may also include compounds of two or more atoms connected by one or more covalent bonds, ionic bonds, coordination bonds, or the like. For example, suitable molecules may include water, hydrogen, nitrogen, oxygen, carbon monoxide, carbon dioxide, sulfur dioxide, hydrogen sulfide, a nitrogen oxide, a C1-C4 alkane, a silane, or a haloacid.

In some examples, the second molecule may be a liquid, e.g., water or an organic solvent, and the first molecule may be a covalent or ionic molecular compound dissolved in the liquid. In some examples, one molecule may be a polar liquid such as water, and the other molecule may be a salt that includes a cation and an anion. Examples of cations for salts may include metal cations, e.g. alkali metal cations such as lithium, sodium, potassium, or the like; alkali earth metal cations such as calcium or magnesium, or the like; cations of transition metals such as copper, iron, nickel, zinc, manganese, or the like; cations of metals in other groups, such as cations of aluminum; and so on. Examples of anions for salts may include, but are not limited to, fluoride, chloride, bromide, iodide, chlorate, bromate, iodate, perchlorate, perbromate, periodate, hydroxide, carbonate, bicarbonate, sulfate, phosphate, and so on. In some examples, the fluid mixture may be a natural water source such as seawater or groundwater, where the perforated graphene membrane may be employed to separate water from natural solutes, such as sodium chloride, and/or unnatural solutes, such as molecules that are manmade pollutants.

FIG. 1 illustrates an example gas filtration device, including a plurality of parallel carbon nanotubes, arranged in accordance with at least some embodiments described herein. As shown in diagram 100, an example gas filtration device may include a first substrate 102 and a second substrate 108, a plurality of carbon nanotubes 106, a fluid mixture 110 that includes molecules 104, 105, first openings 112, and second openings 114.

In an example embodiment, the first substrate 102 and the second substrate 108 may be positioned substantially opposite and parallel to each other. The plurality of carbon nanotubes 106 may extend from the first substrate 102 to the second substrate 108 in a perpendicular orientation with respect to the first and second substrates. Each carbon nanotube may be hollow for enabling a fluid mixture 110 including two or more molecules 104, 105 to pass through the hollow center of the carbon nanotube. A first end of each carbon nanotube may be embedded in the first substrate 102, and a second end of each carbon nanotube may be embedded in the second substrate 108. The first openings 112 of the carbon nanotubes may be exposed at the first substrate 102, and the second openings 114 of the carbon nanotubes may be exposed at the second substrate 108. The first and second substrates may be may be permeable or non-permeable substrates.

The plurality of carbon nanotubes may be embedded in the first substrate 102 and second substrate 108 in close proximity to each other. For example, the plurality of carbon nanotubes may be characterized by an areal density at the first and second substrates calculated as a percentage of the surface area of a substrate occupied by carbon nanotubes. The areal density percentage may be in a range from about 0.01% to about 90%, from about 0.1% to about 70%, from about 1% to about 50%, from about 2% to about 30%, from about 0.1% to about 25%, from about 1% to about 20%, from about 0.1% to about 15%, from about 0.1% to about 10%, or from about 1% to about 10%. Additionally, each carbon nanotube may be a single-walled carbon nanotube composed from a graphene membrane. The graphene membrane may include a plurality of discrete pores of a selected size for enabling one or more molecules of a certain size to cross the graphene membrane by passing through the pores.

The gas filtration device including the plurality of carbon nanotubes extending between the first and second substrates may enable the fluid mixture 110 to be filtered by passing the fluid mixture 110 through the plurality of carbon nanotubes 106. The fluid mixture 110 may include a plurality of first molecules 104 and a plurality of second molecules 105, which may be a larger size than the first molecules 104. The fluid mixture 110 may be passed through the plurality of carbon nanotubes 106 for filtering the fluid mixture 110 such that the first molecules 104 may be separated from the second molecules 105 to form a filtrate fraction that includes the first molecules 104 and a retentate fraction that includes the second molecules 105.

The fluid mixture 110 may be provided at the first openings 112 in the first substrate 102 and may be directed through the carbon nanotubes. The fluid mixture 110 may be filtered by passing the smaller first molecules 104 through the discrete pores of the carbon nanotube walls as the fluid mixture 110 passes through the carbon nanotubes. The filtrate fraction that includes the first molecules 104 may be collected in a space surrounding the plurality of carbon nanotubes between the first substrate 102 and the second substrate 108. The retentate fraction of the filtered fluid mixture that includes the larger second molecules 105 may be retained within the plurality of carbon nanotubes. The retentate fraction that includes the larger second molecules 105 may be collected at the second openings 114 in the second substrate 108.

In another example, the fluid mixture 110 may be provided along an external surface of the plurality of carbon nanotubes in the space surrounding the plurality of nanotubes between the first substrate and the second substrate. The first molecules 104 may pass through the discrete pores into the hollow interior space of the carbon nanotubes to form the filtrate fraction. The filtrate fraction including the first molecules 104 may be collected at the first openings and second openings on either end of the plurality of nanotubes. The retentate fraction including the second molecules 105 may be collected from the space surrounding the plurality of nanotubes between the first substrate and the second substrate.

Figure 2:
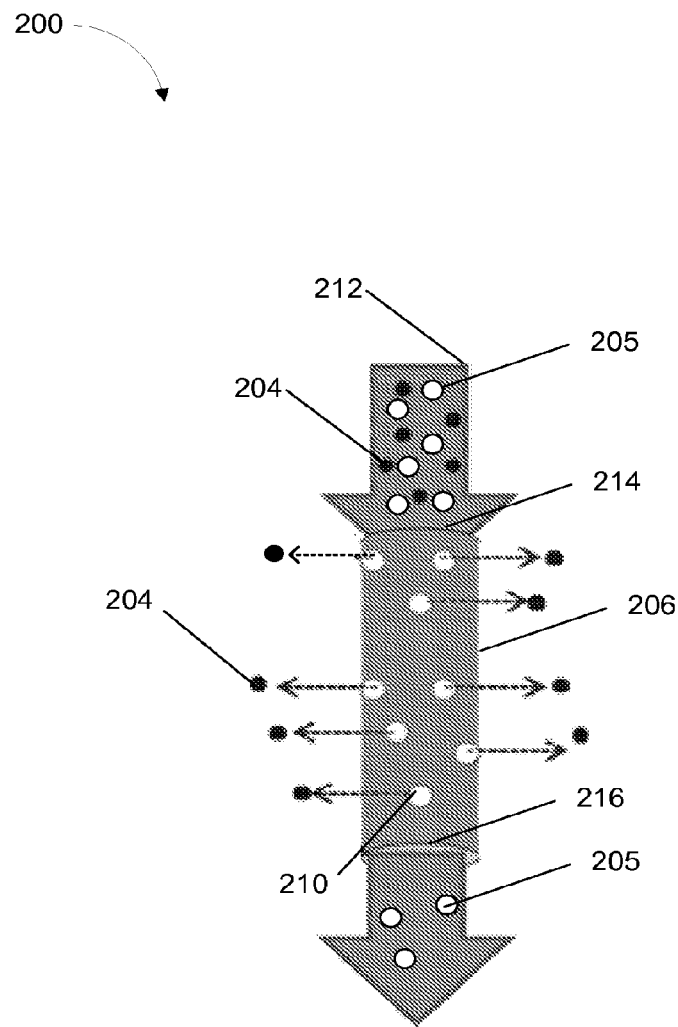
FIG. 2 illustrates an example carbon nanotube for use in a gas filtration device.

FIG. 2 illustrates an example carbon nanotube for use in a gas filtration device, arranged in accordance with at least some embodiments described herein. As shown in diagram 200, an example gas filtration device may include a carbon nanotube 206 that includes a plurality of discrete pores 210, a fluid mixture 212 that includes molecules 204, 205, a first opening 214, and a second opening 216.

The carbon nanotube 206 may enable the fluid mixture 212 that includes two or more molecular species 204, 205 to be filtered. The carbon nanotube 206 may be composed of a graphene membrane in cylindrical form. The graphene membrane of the carbon nanotube 206 may include a plurality of discrete pores 210 to enable at least one of the molecular species to cross the graphene membrane by passing through the discrete pores 210. The fluid mixture 212 may be directed through the first opening 214 of the carbon nanotube 206, and at least a portion of the fluid mixture 212 may be collected at the second opening 216 of the carbon nanotube 206.

The fluid mixture 212 may be separated into a filtrate fraction that includes the first molecular species 204 symbolized by dark-filled circles and a retentate fraction that includes the second molecular species 205 symbolized by white-filled circles. The first and second molecular species may also include one or more differences in atomic or chemical character such as differences in elemental composition, isotopic composition, molecular structure, size, mass, hydrophobicity, charge distribution, or the like. For example, the first molecular species 204 may be smaller than the second molecular species 205 as symbolized by the relative sizes of the filled circles in FIG. 2, and the first molecular species 204 and the second molecular species 205 may be separated into the filtrate and retentate fractions based on size.

The carbon nanotube 206 may be a singled walled carbon nanotube composed from a perforated graphene membrane. The graphene membrane may be a graphene monolayer having a thickness of about one atom. The graphene monolayer may include a plurality of discrete pores 210 of a selected size to enable at least one of the molecular species of the fluid mixture to cross the graphene membrane by passing through the discrete pores. In some examples, the discrete pores 210 may be characterized by a diameter that may be selective for passage of the first molecular species 204 compared to the second molecular species 205 based on the one or more differences in atomic or chemical character, e.g., size. Each carbon nanotube 206 may have a diameter in a range from about one nanometer and about one micrometer, and may have a length in a range in millimeters between about 0.1 and about 30, about 1 and about 25, about 5 and about 30, about 10 and about 30, about 10 and about 25, about 10 and about 20, about 5 and about 20, or about 5 and about 15. A plurality of carbon nanotubes may be arranged in parallel between a first and second substrate to form the gas filtration device such that a surface area of the graphene membrane is increased to filter the fluid mixture.

In an example scenario, the fluid mixture 212 may be filtered by directing the fluid mixture 212 through a first opening 214 of the carbon nanotube 206. The fluid mixture may be filtered by separating the molecular species into the filtrate fraction that includes the first molecular species 204 and the retentate fraction that includes the second molecular species 205. In some examples the first molecular species 204 may be smaller in size than the second molecular species 205. As the fluid mixture passes through the carbon nanotube 206, the first molecular species 204 may be directed through the discrete pores 210 of the carbon nanotube 206 walls to form the filtrate fraction in a space surrounding the carbon nanotube 206. The discrete pores 210 may be of a selected size to enable the smaller molecular species 204 to pass through the discrete pores 210 while preventing the larger second molecular species 205 from passing through. The first molecular species 204 may be directed through the discrete pores 210 by employing a gradient or differential across the graphene membrane. The gradient may include differences in one or more properties such as temperature, pressure, concentration, polarity, or electrochemical potential. The second molecular species 205 may remain within the carbon nanotube 206, and may exit the carbon nanotube 206 at a second opening 216 where the retentate fraction including the second molecular species 205 may be collected. The gradient or differential may include differences in one or more properties such as temperature, pressure, concentration, or electrochemical potential. For example, a temperature gradient may be established by heating or cooling molecules on one side of the membrane compared to the other side of the membrane. Similarly, a pressure gradient may be established by pressurizing or depressurizing one side of the membrane compared to the other side. A concentration gradient may be established, for example, by holding a mixture of gases to be separated on one side of the membrane, e.g., hydrogen and methane, and removing the desired molecule, e.g., hydrogen, from the other side of the membrane as it traverses the membrane. An electrochemical gradient may be established by using the membrane as a cell separator in an electrochemical cell, for example, separating the cathode and anode in water to hydrogen and oxygen electrolysis cell.

Figure 3:
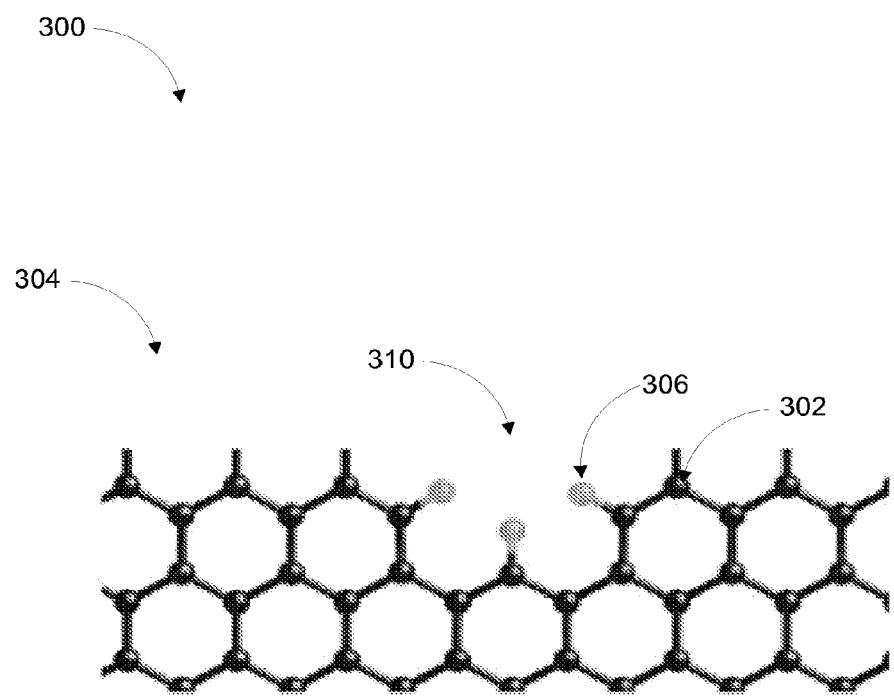
FIG. 3 illustrates a carbon vacancy and passivated pore in an example graphene membrane carbon nanotube.

FIG. 3 illustrates a carbon vacancy and passivated pore in an example graphene membrane carbon nanotube, arranged in accordance with at least some embodiments described herein. As previously described, the carbon nanotubes may be composed of a perforated graphene membrane in a cylindrical form, such that the graphene membrane forms the walls of the carbon nanotubes. As illustrated in diagram 300, the graphene membrane may be a graphene monolayer 304 including a plurality of discrete pores 310. The discrete pores 310 may be formed by selective removal of one or more carbon atoms 302 from the hexagonal graphene lattice. The remaining carbon atoms 302 at the pore may be passivated with hydrogen atoms 306 to provide structural stability.

The discrete pores 310 may be formed by selective removal of one or more carbon atoms from the graphene lattice, causing a plurality of carbon vacancy defects. Each discrete pore in the graphene monolayer may be characterized by the absence of at least one carbon atom 302. The carbon atoms 302 may be removed employing one or more of atomic oxygen etching, electron beam etching, or selective chemical etching techniques. The discrete pores 310 may extend through the graphene monolayer 304 to enable selective passage of molecular species from one side of the graphene monolayer 304 to the other side of the graphene monolayer 304. Each of the discrete pores 310 may have a substantially uniform pore size, and may be characterized by a range from about one carbon vacancy defect and about ten carbon vacancy defects. The discrete pores 310 of the graphene membrane may be of a selected size to provide a separation efficiency between a first molecular species and a second molecular species.

Figure 4:
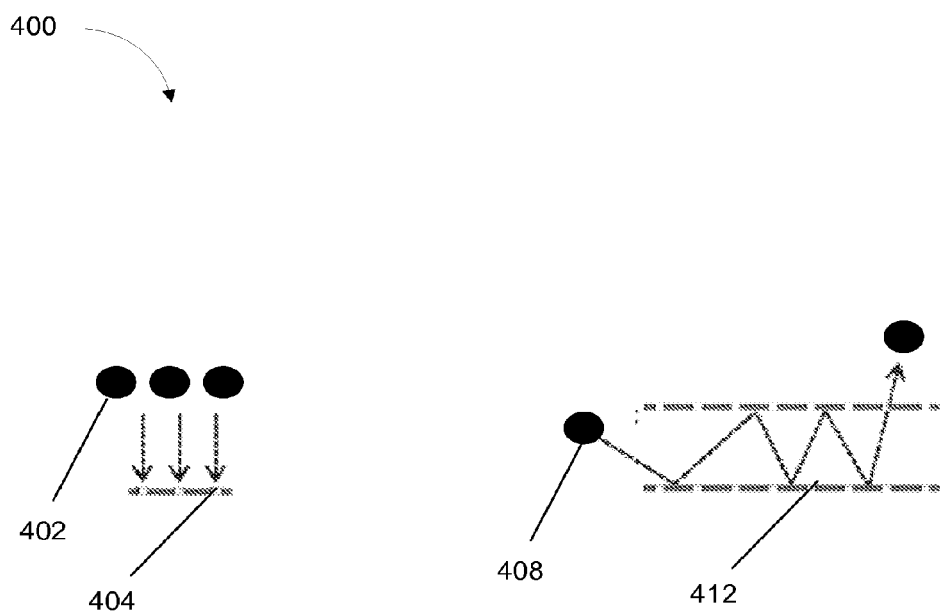
FIG. 4 illustrates motions of a gas molecule in an example filtration system.

FIG. 4 illustrates motions of a gas molecule in an example filtration system, arranged in accordance with at least some embodiments described herein. As previously described, carbon nanotubes in a gas filtration device may be composed of a perforated graphene membrane in a cylindrical form, such that the graphene membrane forms the walls of the carbon nanotubes.

As demonstrated in diagram 400, when a two dimensional flat graphene membrane 404 is employed for filtration of a fluid mixture, the molecules 402 of the fluid mixture may pass through discrete pores in the flat graphene membrane 404 if the trajectories of the molecules 402 contact the flat graphene membrane 404 in direct alignment with the discrete pores of the flat graphene membrane 404. If the trajectories of the molecules 402 do not directly contact the discrete pores of the flat graphene membrane 404, then the molecules 402 may not pass through the discrete pores, sometimes making the two dimensional flat graphene membrane 404 inefficient for filtering the fluid mixture.

The carbon nanotube 412 may increase the efficiency of filtration by enabling more molecules 408 to come into direct contact with and pass through the discrete pores. In the carbon nanotube, the molecules may continuously bounce off the interior walls of the graphene membrane due to the energy of the molecules 408, and the molecules 408 may be in constant interaction with the porous graphene membrane, thus increasing the chance of passage through the discrete pores. Additionally, the carbon nanotube 412 may enable the pores to be positioned in multiple orientations, also increasing the chance of passage through the pores.

Figure 5:
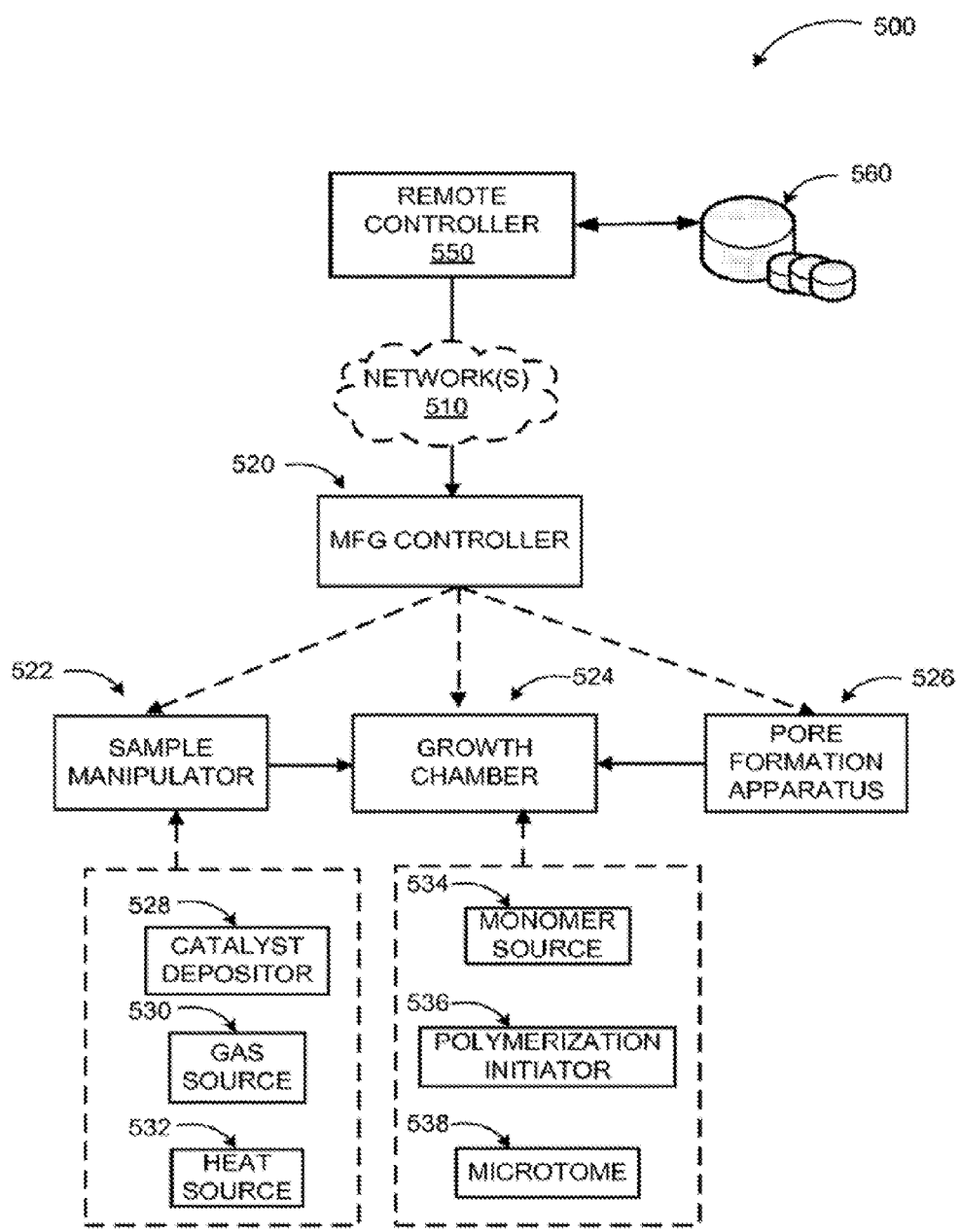
FIG. 5 is a block diagram of an automated system that may be used for making an example filtration system.

FIG. 5 is a block diagram of an automated system that may be used for making an example filtration system, arranged in accordance with at least some embodiments described herein.

System 500 may include a manufacturing controller 520, a sample manipulator 522, a growth chamber 524, a pore formation apparatus 526, a catalyst depositor 528, a gas source 530, a heat source 532, a monomer source 534, a polymerization initiator 536, and a microtome 538.

As illustrated in diagram 500, a gas filtration device including a plurality of carbon nanotubes may be manufactured by forming a plurality of nanotubes between a first substrate and a second substrate. Manufacturing controller 520 may be coupled to machines that can be used to carry out steps for manufacturing the gas filtration device including the plurality of carbon nanotubes. For example, the manufacturing controller 520 may be operable to configure the sample manipulator 522 to facilitate substrate alignment, the growth chamber 524 to facilitate growing the carbon nanotubes, and pore formation apparatus 526 to form discrete pores in the graphene membrane walls of the carbon nanotubes. The manufacturing controller 520 may also be operable to configure the catalyst depositor 528, the gas source 530, and the heat source 532 to initiate growth of the carbon nanotubes. The manufacturing controller 520 may also be operable to configure the monomer source 534, the polymerization initiator 536, and the microtome 538 to facilitate embedding and exposing the ends of the carbon nanotubes in the substrates. The sample manipulator 522 may be inside or outside the growth chamber 524. Manufacturing controller 520 may be operated by human control, or may be directed by a remote controller 550 via network 510. Data associated with controlling the different processes of forming a gas filtration device may be stored at and/or received from data stores 560.

The sample manipulator 522 may facilitate nanotube growth within the growth chamber 524 by providing and holding a growth substrate on a first plate for initiating growth of the carbon nanotubes. Growth of the array of nanotubes may be initiated employing techniques such as chemical vapor deposition, radio frequency magnetron sputtering, oxidation, thermal evaporation and/or remote plasma chemical vapor deposition. The catalyst depositor 528 may deposit a nanoparticulate catalyst on the growth substrate to initiate nanotube growth. The gas source 530 may expose a nanotube feedstock gas to the nanoparticulate catalyst at the growth substrate. The heat source 532 may heat the growth chamber including the nanoparticulate catalyst and the nanotube feedstock gas to a selected nanotube growth temperature to grow the plurality of nanotubes from the nanoparticulate catalyst deposited on the growth substrate. When the carbon nanotubes have grown to a desired length, the sample manipulator 522 may facilitate embedding the first end of the plurality of nanotubes in a first substrate and a second end of the plurality of nanotubes in a second substrate, and removing the growth substrate.

The monomer source 534 may provide a polymerizable monomer in which the first end and the second end of the plurality of the carbon nanotubes may be embedded. The polymerization initiator 536 may polymerize the monomer to form the first substrate including the embedded first end of the plurality of carbon nanotubes and the second substrate including the embedded second end of the plurality of carbon nanotubes. After the first and second ends of the carbon nanotubes have been embedded in the polymerized first and second substrates, the microtome 538 may cut the polymerized monomer that forms the first substrate and the second substrate to expose a first opening at the outer surface of the first substrate and a second opening at the outer surface of the second substrate. Additionally, the pore formation apparatus 526 may facilitate forming discrete pores in the graphene membrane walls of the plurality of carbon nanotubes. The pore formation apparatus 526 may employ one or more of atomic oxygen etching, electron beam etching, or selective chemical etching for removing one or more carbon atoms from a plurality of locations within the carbon nanotubes causing a plurality of carbon vacancy defects in the carbon nanotubes.

Example 1A

Preparation of Carbon Nanotube Growth Catalyst

In an example technique for making the nanotube catalyst, frequency magnetron sputtering or thermal evaporation may be employed to deposit a first aluminum thin film (e.g., 10 to 20 nm) on a $SiO_2$ (e.g., 200 nm)/Si wafer. The first aluminum thin film may be oxidized at 600-700° C. in air to form a first alumina supporting film. An ultrathin iron film may be formed by evaporating iron using an electron beam onto the alumina. The ultrathin iron film may be thermally oxidized at 600° C. for approximately 10 min in air to form an ultrathin iron oxide film. The resulting thickness of the catalyst film may be measured, for example, to be between 0.5 and 0.8 nanometers.

EXAMPLE 1B

Preparation of Carbon Nanotube Growth Catalyst

In another example technique for making the nanotube catalyst, frequency magnetron sputtering or thermal evaporation may be employed to deposit a first aluminum thin film (e.g., 10 to 20 nm) on a $SiO_2$ (e.g., 200 nm)/Si wafer. The first aluminum thin film may be oxidized at 600-700° C. in air to form a first alumina supporting film. An ultrathin iron film may be formed by evaporating iron using an electron beam onto the alumina. A second round of frequency magnetron sputtering or thermal evaporation may be employed to deposit a second aluminum thin film (e.g., 10 to 20 nm) on the oxidized iron layer. The second aluminum thin film may be oxidized at 600-700° C. in air to form a second alumina film to result in a sandwich structure of about 0.5 nm $Al_2O_3$ 0.3-0.5 nm Fe/5 nm $Al_2O_3$. The sandwich catalyst film may be preheated at 600° C. for 5 mm to convert the Fe film into catalyst nanoparticies. The resulting thickness of the catalyst film may be measured, for example, to be between 1.3 and 1.5 nanometers. The catalyst-coated substrate of either Example 1A or Example 1B may be loaded in a quartz tube reactor, and the reactor may be heated to 450° C. for 5 to 10 min in the presence of approximately 5 mTorr of water vapor. Next, $CH_4$ (60 sccm) may be introduced into the quartz tube reactor. A CVD plasma may be created by applying 15 W of radio frequency energy at around 13.56 MHz at a working pressure of about 0.5 torr. At a growth rate of about 300 μm/h, a 1 millimeter high array of carbon nanotubes may be grown in a little over 3 hours and a 10 mm high forest can be grown in about a day and a half.

EXAMPLE 2B

Remote Plasma Growth of Carbon Nanotube Array

Another example technique may employ remote plasma chemical vapor deposition. The catalyst-coated substrate of either Example 1A or Example 1B may be loaded in a quartz tube reactor, and the reactor may be heated to 450° C. for 5 to 10 min in the presence of approximately 5 mTorr of water vapor. Next, a mixture of $H_2$ and $CH_4$ gases may be directed over the heated substrate at 45 and 5 sccm, respectively at a total pressure of 20 Torr. A microwave power of 60 W may be applied, and the carbon nanotubes allowed to grow until a desired height is reached. At a growth rate of about 300 μm/h, a 1 millimeter high array of carbon nanotubes may be grown in a little over 3 hours and a 10 mm high forest can be grown in about a day and a half.

EXAMPLE 3

Embedding Carbon Nanotube Array in Polymer

A layer of epoxy precursor (~1 mm) in a filter ring mount may be contacted to a carbon nanotube forest (e.g., ~12 mm tall) prepared by either Example 1B or Example 2B. The epoxy precursor may be, for example, a high-viscosity (200 000-500 000 centiPoise), room temperature fast-curing (20 min) epoxy (e.g., LOCTITE® 1C™ M HYSOL®, Henkel Corp., Rocky Hill, Conn.) The epoxy precursor may be applied by dipping, spraying, or spin-coating. The epoxy precursor may be allowed to penetrate to about 1 mm into the carbon nanotube forest and may be sprayed with a UV curing solution (e.g., Microchem SU-8 2005, 2025 or 2050 with viscosities of 52, 5485 and 17 850 cP respectively, Microchem, Boston, Mass.). The epoxy may be cured with UV light. The cured end of the carbon nanotube forest may be held by the supporting filter mount ring, to which it is bonded, and the base of the carbon nanotube forest may be severed from its growth substrate, e.g. using a razor blade. The process may be repeated on the free (base) end of the carbon nanotube forest. The cured ends of the carbon nanotube forest may be cut to remove excess epoxy and expose the open ends of the carbon nanotubes, e.g., using a microtome. The resulting nanoporous membrane structure may be confirmed by electron microscopy, anisotropic electrical conductivity, gas flow, and ionic transport measurements. For example, Knudsen diffusion may be employed to show gas transfer through the open nanotube ends and not via diffusion through the polymer block.

EXAMPLE 4

Forming Pores in the Carbon Nanotube Array

Discrete pores may be formed by selective removal of one or more carbon atoms from the carbon nanotube walls, causing a plurality of carbon vacancy defects. The carbon atoms may be removed employing one or more of atomic oxygen etching, electron beam etching, or selective chemical etching techniques. Other techniques may include UV-induced oxidative etching, ion beam etching and/or lithographic masking coupled with oxygen plasma etching. For example, the carbon nanotubes of any of Examples 1B, 2B, or 3 may be contacted with a solution of a silyl azide which may be heated or photolyzed to generate a silyl nitrene radical. The silyl nitrene radical may react with carbon-carbon double bonds in the carbon nanotube to form silyl aziridines incorporated into the carbon nanotube wall. Separation between adjacent silyl aziridines may be provided by using a minimal amount of the silyl azide. Separation between adjacent silyl aziridines may also be provided using a silyl azide functionalized with a bulky alkyl or aryl group such that the steric bulk may provide a minimum separation according to the steric bulk of adjacent silyl azide/silyl aziridines. The silyl azide may be cleaved using a solution including fluoride ion to leave aziridine groups at the carbon nanotube surface. The aziridine groups may be pyrolyzed or thermalized by heating between 100° C. and 400° C. for 10 minutes to 1 hour to eject HCN and to leave a pore having a 1 carbon atom vacancy. The aziridine groups may also be first hydrolyzed to form beta-amino alcohol functionality, which may then be pyrolyzed or thermalized by heating between 100° C. and 400° C. for 10 minutes to 1 hour to eject ammonia and formaldehyde to leave a pore having a 2 carbon atom vacancy. The pores may be passivated by heating to 100° C. and 400° C. in the presence of hydrogen gas for 10 minutes to 1 hour.

Figure 6:
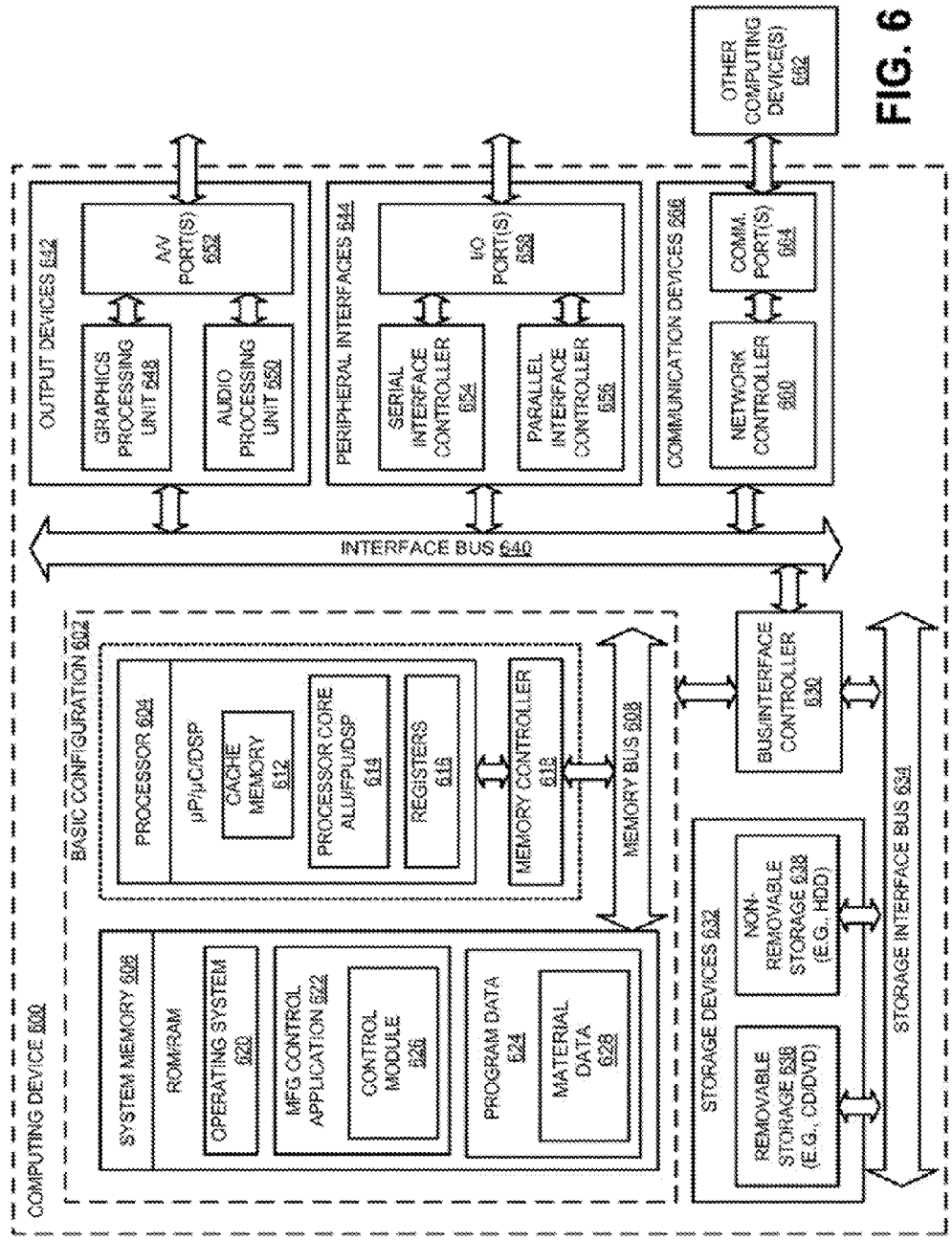
FIG. 6 illustrates a general purpose computing device, which may be used to control a system for making an example filtration system.

FIG. 6 illustrates a general purpose computing device, which may be used to control a system for making an example filtration system, arranged in accordance with at least some embodiments described herein In a basic configuration 602, computing device 600 may include one or more processors 604 and a system memory 606. A memory bus 608 may be used for communicating between processor 604 and system memory 606.

Depending on the desired configuration, processor 604 may be of any type including but not limited to a microprocessor (µP), a microcontroller (µC), a digital signal processor (DSP), or any combination thereof. Processor 604 may include one more levels of caching, such as a cache memory 612, a processor core 614, and registers 616. Example processor core 614 may include an arithmetic logic unit (ALU), a floating point unit (FPU), a digital signal processing core (DSP Core), or any combination thereof. An example memory controller 618 may also be used with processor 604, or in some implementations memory controller 615 may be an internal part of processor 604.

Figure 8:
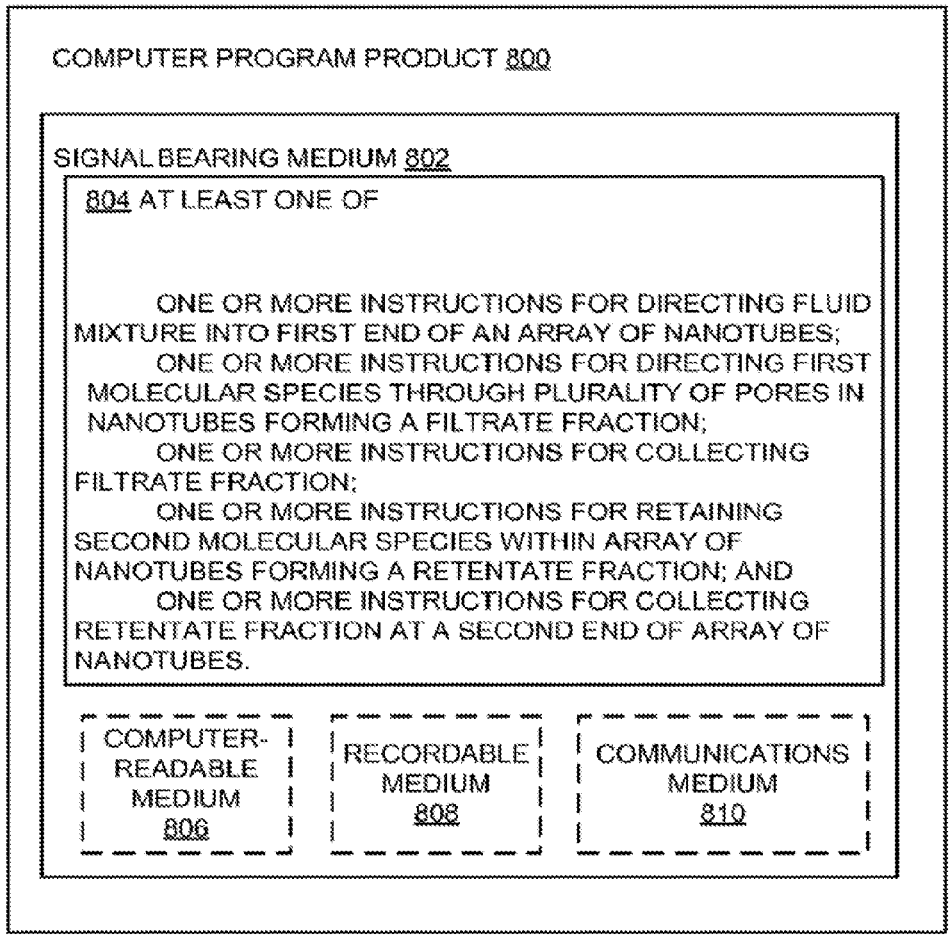
FIG. 8 illustrates a block diagram of an example computer program product, all arranged in accordance with at least some embodiments described herein.

Depending on the desired configuration, system memory 606 may be of any type including but not limited to volatile memory (such as RAM), non-volatile memory (such as ROM, flash memory, etc.) or any combination thereof. System memory 606 may include an operating system 620, one or more manufacturing control applications 622, and program data 624. Manufacturing control application 622 may include a control module 626 that may be arranged to control automated machine 500 of FIG. 5 and any other processes, methods and functions as discussed above. Program data 624 may include, among other data, material data 628 for controlling various aspects of the automated machine 500. This described basic configuration 602 is illustrated in FIG. 8 by those components within the inner dashed line.

Computing device 600 may have additional features or functionality, and additional interfaces to facilitate communications between basic configuration 602 and any required devices and interfaces. For example, a bus/interface controller 630 may be used to facilitate communications between basic configuration 602 and one or more data storage devices 632 via a storage interface bus 634. Data storage devices 632 may be removable storage devices 636, non-removable storage devices 638, or a combination thereof. Examples of removable storage and non-removable storage devices include magnetic disk devices such as flexible disk drives and hard-disk drives (HDD), optical disk drives such as compact disk (CD) drives or digital versatile disk (DVD) drives, solid state drives (SSD), and tape drives to name a few. Example computer storage media may include volatile and nonvolatile, removable and non-removable media implemented in any method or technology for storage of information, such as computer readable instructions, data structures, program modules, or other data.

System memory 606, removable storage devices 636 and non-removable storage devices 638 may be examples of computer storage media. Computer storage media may include, but is not limited to, RAM, ROM, EEPROM, flash memory or other memory technology, CD-ROM, digital versatile disks (DVD) or other optical storage, magnetic cassettes, magnetic tape, magnetic disk storage or other magnetic storage devices, or any other medium which may be used to store the desired information and which may be accessed by computing device 600. Any such computer storage media may be part of computing device 600.

Computing device 600 may also include an interface bus 640 for facilitating communication from various interface devices (e.g., output devices 642, peripheral interfaces 644, and communication devices 666) to basic configuration 602 via bus/interface controller 630. Example output devices 642 may include a graphics processing unit 648 and an audio processing unit 650, which may be configured to communicate to various external devices such as a display or speakers via one or more A/V ports 652. Example peripheral interfaces 544 may include a serial interface controller 654 or a parallel interface controller 656, which may be configured to communicate with external devices such as input devices (e.g., keyboard, mouse, pen, voice input device, touch input device, etc.) or other peripheral devices (e.g., printer, scanner, etc.) via one or more I/O ports 658. An example communication device 666 may include a network controller 660, which may be arranged to facilitate communications with one or more other computing devices 662 over a network communication link via one or more communication ports 664.

The network communication link may be one example of a communication media. Communication media may be embodied by computer readable instructions, data structures, program modules, or other data in a modulated data signal, such as a carrier wave or other transport mechanism, and may include any information delivery media. A "modulated data signal" may be a signal that has one or more of its characteristics set or changed in such a manner as to encode information in the signal. By way of example, and not limitation, communication media may include wired media such as a wired network or direct-wired connection, and wireless media such as acoustic, radio frequency (RF), microwave, infrared (IR) and other wireless media. The term computer readable media as used herein may include both storage media and communication media.

Computing device 600 may be implemented as a portion of a physical server, virtual server, a computing cloud, or a hybrid device that may include any of the above functions. Computing device 600 may also be implemented as a personal computer including both laptop computer and non-laptop computer configurations. Moreover computing device 600 may be implemented as a networked system or as part of a general purpose or specialized server.

Networks for a networked system including computing device 600 may comprise any topology of servers, clients, switches, routers, modems, Internet service providers, and any appropriate communication media (e.g., wired or wireless communications). A system according to embodiments may have a static or dynamic network topology. The networks may include a secure network such as an enterprise network (e.g., a LAN, WAN, or WLAN), an unsecure network such as a wireless open network (e.g., IEEE 602.11 wireless networks), or a world-wide network such as (e.g., the Internet). The networks may also comprise a plurality of distinct networks that may be adapted to operate together. Such networks may be configured to provide communication between the nodes described herein. By way of example, and not limitation, these networks may include wireless media such as acoustic, RF, infrared and other wireless media. Furthermore, the networks may be portions of the same network or separate networks.

Figure 7:
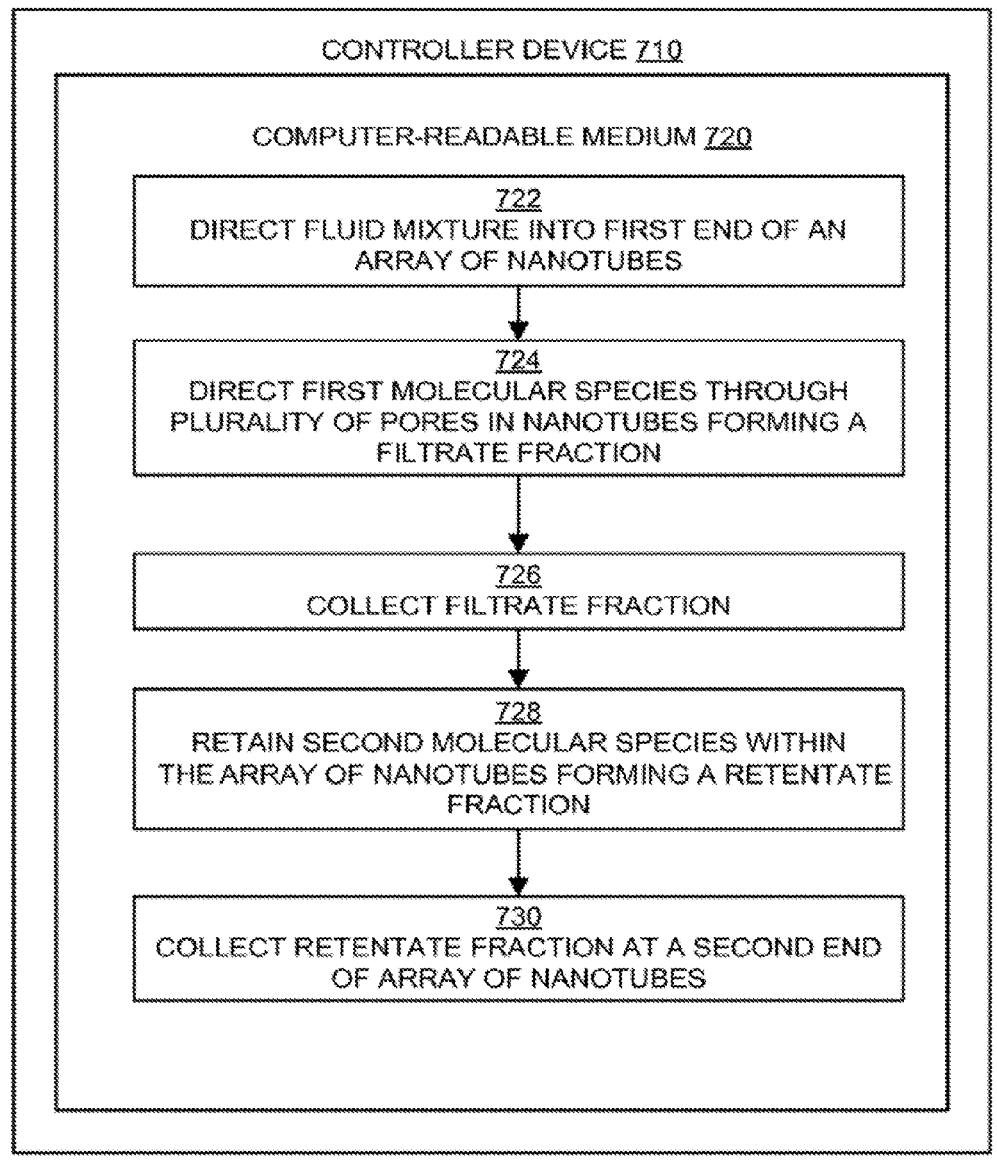
FIG. 7 is a flow diagram illustrating an example method that may be performed for filtering a fluid mixture through a gas filtration device including a plurality of carbon nanotubes.

FIG. 7 is a flow diagram illustrating an example method that may be performed for filtering a fluid mixture through a gas filtration device including a plurality of carbon nanotubes 6, arranged in accordance with at least some embodiments described herein. Example methods may include one or more operations, functions or actions as illustrated by one or more of blocks 722, 724, 726, 728 and/or 830. The operations described in blocks 722 through 730 may also be stored as computer-executable instructions in a computer-readable medium such as computer-readable medium 720 of controlling device 710.

A process of filtering a fluid mixture through a gas filtration device including a plurality of carbon nanotubes may begin with block 722, "DIRECT FLUID MIXTURE INTO FIRST END OF AN ARRAY OF NANOTUBES." At block 722, a fluid mixture 212 may be provided and directed into a first opening 214 of a plurality of carbon nanotubes 206 embedded in a first substrate. The fluid mixture 212 may be a mixture in a gas phase, liquid phase, or supercritical phase, and may include two or more distinct molecular species which may be separated based on properties of each species, such as size. For example, the fluid mixture 212 may include a first molecular species 204 and a second molecular species 205, which may be a larger size than the first molecular species 204. Each nanotube in the plurality of nanotubes may be composed of a graphene membrane, which may be characterized by a plurality of discrete pores 210 of a selected size for enabling one or more molecules of a certain size to pass through the discrete pores.

Block 722 may be followed by block 724, "DIRECT FIRST MOLECULAR SPECIES THROUGH PLURALITY OF PORES IN NANOTUBES FORMING A FILTRATE FRACTION." The fluid mixture 212 may pass through the plurality of carbon nanotubes 206, and the first molecular species 204 may be directed through the plurality of discrete pores 210 such that the first molecular species 204 may be separated from the second molecular species 205 to form a filtrate fraction including the first molecular species.

Block 724 may be followed by block 726, "COLLECT FILTRATE FRACTION." The filtrate fraction including the first molecular species 204 may be collected in a space surrounding the plurality of carbon nanotubes 206 between the first substrate and the second substrate.

Block 726 may be followed by block 728, "RETAIN SECOND MOLECULAR SPECIES WITHIN THE ARRAY OF NANOTUBES FORMING A RETENTATE FRACTION." As the first molecular species 204 is directed through the discrete pores 210, a retentate fraction of the filtered fluid mixture including the larger second molecular species 205 may be retained within the plurality of carbon nanotubes 206.

Block 728 may be followed by block 730, "COLLECT RETENTATE FRACTION AT A SECOND END OF ARRAY OF NANOTUBES." The retentate fraction including the second molecular species 205 may be collected at the second openings 216 of the carbon nanotubes where there are embedded in the second substrate.

FIG. 8 illustrates a block diagram of an example computer program product, arranged in accordance with at least some embodiments described herein. In some examples, as shown in FIG. 8, computer program product 800 may include a signal bearing medium 802 that may also include machine readable instructions 804 that, when executed by, for example, a processor, may provide the functionality described above with respect to FIG. 6 and FIG. 7. Thus, for example, referring to processor 604, the control module 626 may undertake one or more of the tasks shown in FIG. 8 in response to instructions 804 conveyed to processor 604 by signal bearing medium 802 to perform actions associated with filtering a fluid mixture through a gas filtration device including a plurality of carbon nanotubes as described herein. Some of those instructions may include directing a fluid mixture into a first end of an array of nanotubes, directing a first molecular species through a plurality of pores in the nanotubes forming a filtrate fraction, collecting the filtrate fraction, retaining a second molecular species within the array of nanotubes forming a retentate fraction, and collecting the retentate fraction at a second end of the array of nanotubes.

In some implementations, signal bearing medium 802 depicted in FIG. 8 may encompass a computer-readable medium 806, such as, but not limited to, a hard disk drive, a Compact Disc (CD), a Digital Versatile Disk (DVD), a digital tape, memory, etc. In some implementations, signal bearing medium 802 may encompass a recordable medium 808, such as, but not limited to, memory, read/write (R/W) CDs, R/W DVDs, etc. In some implementations, signal bearing medium 802 may encompass a communications medium 810, such as, but not limited to, a digital and/or an analog communication medium (e.g., a fiber optic cable, a waveguide, a wired communications link, a wireless communication link, etc.). Thus, for example, computer program product 800 may be conveyed to one or more modules of the processor 504 by an RF signal bearing medium 802, where the signal bearing medium 802 is conveyed by a wireless communications medium 810 (e.g., a wireless communications medium conforming with the IEEE 802.11 standard).

Generally, program modules include routines, programs, components, data structures, and other types of structures that perform particular tasks or implement particular abstract data types. Moreover, those skilled in the art will appreciate that embodiments may be practiced with other computer system configurations, including hand-held devices, multiprocessor systems, microprocessor-based or programmable consumer electronics, minicomputers, mainframe computers, and comparable computing devices. Embodiments may also be practiced in distributed computing environments where tasks may be performed by remote processing devices that may be linked through a communications network. In a distributed computing environment, program modules may be located in both local and remote memory storage devices.

Embodiments may be implemented as a computer-implemented process (method), a computing system, or as an article of manufacture, such as a computer program product or computer readable media. The computer program product may be a computer storage medium readable by a computer system and encoding a computer program that may include instructions for causing a computer or computing system to perform example process(es). The computer-readable storage medium can for example be implemented via one or more of a volatile computer memory, a non-volatile memory, a hard drive, a flash drive, a floppy disk, or a compact disk, and comparable media.

Throughout this specification, the term "platform" may be a combination of software and hardware components for providing a configuration environment, which may facilitate configuration of software/hardware products and services for a variety of purposes. Examples of platforms include, but are not limited to, a hosted service executed over multiple servers, an application executed on a single computing device, and comparable systems. The term "server" generally refers to a computing device executing one or more software programs typically in a networked environment. However, a server may also be implemented as a virtual server (software programs) executed on one or more computing devices viewed as a server on the network. More detail on these technologies and example operations is described below.

According to some examples, the present disclosure describes a filtering device. The filtering device may include a first substrate, a second substrate, and an array of nanotubes having porous walls selective for the passage of one or more molecules across the porous walls, the array of nanotubes extending between the first substrate and the second substrate, each nanotube having a first opening embedded in the first substrate and a second opening embedded in the second substrate such that a fluid mixture comprising at least a first molecule and a second molecule may be provided into one of the first or the second openings and one of the first and second molecules may be filtered through the porous walls.

According to some examples, each nanotube in the array of nanotubes may be a single-walled carbon nanotube composed from a graphene membrane. The fluid mixture may be one of a gas mixture, a liquid mixture, or a supercritical mixture. The graphene membrane includes a plurality of discrete pores having a size selective for the passage of one or more gas molecules across the graphene membrane.

According to some examples, each pore of the plurality of discrete pores may be characterized by at least one carbon vacancy defect. Each pore of the plurality of discrete pores may be characterized by a range from about one carbon vacancy defect and about ten carbon vacancy defects.

According to other examples, the first substrate and the second substrate may be each independently formed by polymerization of a liquid monomer composition including one or more of: an epoxy monomer, a urethane monomer, a cyanoacrylate monomer, a siloxane monomer, and/or an acrylic monomer. The second substrate may be configured in a substantially parallel orientation with respect to the first substrate. Each nanotube in the array of nanotubes may be configured in a substantially parallel orientation with respect to the remaining nanotubes. The array of nanotubes may be configured in a substantially perpendicular orientation with respect to the first substrate and the second substrate. The array of nanotubes may be arranged such that the fluid mixture may be exposed to first openings of the nanotubes in the first substrate, filtered through the walls of the nanotubes as the fluid mixture passes through the nanotubes, and the filtered fluid mixture may be collected at second openings in the second substrate.

According to some examples, the array of nanotubes may be arranged such that the fluid mixture may be exposed to the first openings in the first substrate, filtered through the walls of the nanotubes as the fluid mixture passes through the nanotubes, and the filtered fluid mixture may be collected in a space surrounding the array of nanotubes between the first substrate and the second substrate. The nanotubes have diameters in a range in nanometers between about 1 and about 1000. The nanotubes have an approximate length in a range in millimeters between about 0.1 and about 30. The array of nanotubes may be characterized by an areal density percentage at the first substrate or the second substrate in a range of from about 0.01% to about 90%.

According to other examples, the present disclosure also describes a method of forming a filtering device with an array of nanotubes. The method may include growing an array of nanotubes, embedding a first end of the array of nanotubes in a first substrate, embedding a second end of the array of nanotubes in a second substrate such that an inner surface of the first substrate faces an inner surface of the second substrate to define a gap between the inner surfaces, wherein the gap may be crossed by the array of nanotubes, preparing an outer surface of the first substrate such that each nanotube in the array of nanotubes includes a first opening at the outer surface of the first substrate, preparing an outer surface of the second substrate such that each nanotube in the array of nanotubes includes a second opening at the outer surface of the second substrate, such that the outer surfaces of the first substrate and the second substrate may be in fluid communication through each of the nanotubes, forming a plurality of pores in each nanotube of the array of nanotubes, and coupling one or more walls to the first substrate and the second substrate, such that fluid communication between the outer surfaces of the first and second substrates may be controlled through the array of nanotubes, such that fluid communication between the outer surfaces and the gap between the inner surfaces may be controlled by the plurality of pores in the nanotubes.

According to some examples, the method may also include positioning the first substrate and the second substrate in a substantially parallel orientation. The method may also include forming the nanotubes in a substantially parallel orientation with respect to each nanotube in the array of nanotubes. The method may also include the array of nanotubes in a substantially perpendicular orientation with respect to the first and the second substrates.

According to some examples, the method may also forming the array of nanotubes by depositing a nanoparticulate catalyst on a growth substrate, exposing the nanoparticulate catalyst to a nanotube feedstock gas such that the nanoparticulate catalyst may be brought in contact with the nanotube feedstock gas, initiating growth of the array of nanotubes by heating the nanoparticulate catalyst and the nanotube feedstock gas to a nanotube growth temperature, growing the array of nanotubes to a desired length, embedding the first end of the array of nanotubes in the first substrate and the second end of the array of nanotubes in the second substrate, and removing the growth substrate.

According to some examples initiating growth of the array of nanotubes may also include employing one or more of chemical vapor deposition, radio frequency magnetron sputtering, oxidation, thermal evaporation and/or remote plasma chemical vapor deposition.

According to some examples embedding the first end and the second end of the array of nanotubes may also include independently embedding the first end and the second end of the array of nanotubes in a polymerizable monomer, and polymerizing the monomer to form the first substrate and the second substrate.

According to some examples embedding the first end and the second end of the array of nanotubes may also include embedding the first and second ends of the array of nanotubes in a liquid monomer composition including one or more of: an epoxy monomer, a urethane monomer, a cyanoacrylate monomer, a siloxane monomer, and/or an acrylic monomer.

According to some examples, preparing the outer surfaces of the first substrate and the second substrate may include employing a microtome to cut the polymerized monomer that forms the first substrate and the second substrate such that each nanotube in the array of nanotubes includes the first opening at the outer surface of the first substrate and the second opening at the outer surface of the second substrate. The method may also include forming the array of nanotubes as single-walled carbon nanotubes. The method may also include removing one or more carbon atoms from a plurality of locations within the single-walled carbon nanotubes causing a plurality of carbon vacancy defects in the single-walled carbon nanotubes. Forming the plurality of pores in each nanotube of the array of nanotubes may include employing one or more of: atomic oxygen etching, electron beam etching, or selective chemical etching.

According to further examples, the present disclosure also describes system for forming a filtering device with parallel nanotubes. The system may include a nanotube growth chamber, a sample manipulator configured to hold a growth substrate in the nanotube growth chamber, a catalyst depositor configured to deposit a nanoparticulate catalyst, a gas source configured to deliver gas to the nanotube growth chamber, a heater configured to heat the nanotube growth chamber, a monomer source operatively coupled to the sample manipulator, a polymerization initiator, a microtome, a pore forming apparatus, and a controller configured by machine executable instructions, the controller coupled with the nanotube growth chamber, the sample manipulator, the catalyst depositor, the gas source, the heater, the monomer source, the polymerization initiator, the microtome, and the pore forming apparatus. The controller may be operable to configure the sample manipulator to hold the growth substrate, configure the catalyst depositor to deposit a nanoparticulate catalyst on the growth substrate, configure the gas source to expose a nanotube feedstock gas to the nanoparticulate catalyst deposited on the growth substrate, configure the heater to heat the nanotube growth chamber such that an array of nanotubes grows from the nanoparticulate catalyst deposited on the growth substrate, configure the monomer source to independently embed a first end and a second end of the array of nanotubes in a monomer, configure the polymerization initiator to polymerize the monomer to form a first substrate at the first end of the array of nanotubes and a second substrate at the second end of the array of nanotubes, configure the sample manipulator to remove the growth substrate, configure the microtome to cut the polymerized monomer that forms the first substrate and the second substrate such a first opening of each nanotube may be exposed at an outer surface of the first substrate and a second opening of each nanotube may be exposed at an outer surface of the second substrate, and configure the pore forming apparatus to form a plurality of pores in each nanotube in the array of nanotubes.

According to some examples, the first substrate and the second substrate may be positioned in a substantially parallel orientation. Each nanotube in the array the nanotubes may be positioned in a substantially parallel orientation with respect to the remaining nanotubes. The nanotubes may be positioned in a substantially perpendicular orientation with respect to the first and the second substrates. Growth of the array of nanotubes may be initiated employing one or more of chemical vapor deposition, radio frequency magnetron sputtering, oxidation, thermal evaporation and/or remote plasma chemical vapor deposition.

According to some examples, the polymerizable monomer may be selected from a liquid monomer composition including one or more of: an epoxy monomer, a urethane monomer, a cyanoacrylate monomer, a siloxane monomer, and/or an acrylic monomer. The array of nanotubes may be formed as single-walled carbon nanotubes. One or more carbon atoms may be removed from a plurality of locations within the nanotubes causing a plurality of carbon vacancy defects in the nanotubes. The plurality of pores in each nanotube of the array of nanotubes may be formed employing one or more of: atomic oxygen etching, electron beam etching, or selective chemical etching.

According to some examples, the present disclosure may also include a method of filtering a fluid mixture. The method may include exposing the fluid mixture to a first end of an array of nanotubes embedded in a first substrate, wherein the fluid mixture comprises at least a first molecular species and a second molecular species, directing the first molecular species through a plurality of pores located in each nanotube in the array of nanotubes to form a filtrate fraction that includes at least a portion of the first molecular species, collecting the filtrate fraction that includes the first molecular species, retaining the second molecular species within the array of nanotubes to form a retentate fraction that includes at least a portion of the second molecular species, and collecting the retentate fraction at a second end of the array of nanotubes embedded in a second substrate.

According to some examples, exposing the fluid mixture to a first end of an array of nanotubes may include exposing one of: a gas mixture, a liquid mixture, and a supercritical mixture to the first end of the array of nanotubes. The method may include directing the first molecular species through the plurality of pores located in each nanotube by employing a gradient across walls of the nanotubes. The method may also include directing the first molecular species through the plurality of pores located in each nanotube by employing one or more of a temperature, pressure, concentration, polarity, or electrochemical potential gradient across walls of the nanotubes.

According to further examples, the method may also include collecting the filtrate fraction containing the first molecular species in a space surrounding the array of nanotubes between the first substrate and the second substrate. The method may also include exposing the fluid mixture along an external surface of the array of nanotubes in space surrounding the array of nanotubes between the first substrate and the second substrate, directing the first molecular species through the plurality of pores located in each nanotube such that a filtrate fraction that includes the first molecular species may be formed within each nanotube, and collecting the filtrate fraction that includes the first molecular species at one of first openings and second openings on either end of the array of nanotubes. Directing the first molecular species through a plurality of pores located in each nanotube in the array of nanotubes may include directing a gas molecule through the plurality of pores having a size selective for passage of the gas molecule across each nanotube in the array of nanotubes.

There is little distinction left between hardware and software implementations of aspects of systems; the use of hardware or software is generally (but not always, in that in certain contexts the choice between hardware and software may become significant) a design choice representing cost vs. efficiency tradeoffs. There are various vehicles by which processes and/or systems and/or other technologies described herein may be effected (e.g., hardware, software, and/or firmware), and that the preferred vehicle will vary with the context in which the processes and/or systems and/or other technologies are deployed. For example, if an implementer determines that speed and accuracy are paramount, the implementer may opt for a mainly hardware and/or firmware vehicle; if flexibility is paramount, the implementer may opt for a mainly software implementation; or, yet again alternatively, the implementer may opt for some combination of hardware, software, and/or firmware.

The foregoing detailed description has set forth various embodiments of the devices and/or processes via the use of block diagrams, flowcharts, and/or examples. Insofar as such block diagrams, flowcharts, and/or examples contain one or more functions and/or operations, it will be understood by those within the art that each function and/or operation within such block diagrams, flowcharts, or examples may be implemented, individually and/or collectively, by a wide range of hardware, software, firmware, or virtually any combination thereof. In one embodiment, several portions of the subject matter described herein may be implemented via Application Specific Integrated Circuits (ASICs), Field Programmable Gate Arrays (FPGAs), digital signal processors (DSPs), or other integrated formats. However, those skilled in the art will recognize that some aspects of the embodiments disclosed herein, in whole or in part, may be equivalently implemented in integrated circuits, as one or more computer programs running on one or more computers (e.g., as one or more programs running on one or more computer systems), as one or more programs running on one or more processors (e.g. as one or more programs running on one or more microprocessors), as firmware, or as virtually any combination thereof, and that designing the circuitry and/or writing the code for the software and/or firmware would be well within the skill of one of skill in the art in light of this disclosure.

The present disclosure is not to be limited in terms of the particular embodiments described in this application, which are intended as illustrations of various aspects. Many modifications and variations can be made without departing from its spirit and scope, as will be apparent to those skilled in the art. Functionally equivalent methods and apparatuses within the scope of the disclosure, in addition to those enumerated herein, will be apparent to those skilled in the art from the foregoing descriptions. Such modifications and variations are intended to fall within the scope of the appended claims. The present disclosure is to be limited only by the terms of the appended claims, along with the full scope of equivalents to which such claims are entitled. It is to be understood that this disclosure is not limited to particular methods, reagents, compounds compositions or biological systems, which can, of course, vary. It is also to be understood that the terminology used herein is for the purpose of describing particular embodiments only, and is not intended to be limiting.

In addition, those skilled in the art will appreciate that the mechanisms of the subject matter described herein are capable of being distributed as a program product in a variety of forms, and that an illustrative embodiment of the subject matter described herein applies regardless of the particular type of signal bearing medium used to actually carry out the distribution. Examples of a signal bearing medium include, but are not limited to, the following: a recordable type medium such as a floppy disk, a hard disk drive, a Compact Disc (CD), a Digital Versatile Disk (DVD), a digital tape, a computer memory, etc.; and a transmission type medium such as a digital and/or an analog communication medium (e.g., a fiber optic cable, a waveguide, a wired communications link, a wireless communication link, etc.).

Those skilled in the art will recognize that it is common within the art to describe devices and/or processes in the fashion set forth herein, and thereafter use engineering practices to integrate such described devices and/or processes into data processing systems. That is, at least a portion of the devices and/or processes described herein may be integrated into a data processing system via a reasonable amount of experimentation. Those having skill in the art will recognize that a typical data processing system generally includes one or more of a system unit housing, a video display device, a memory such as volatile and non-volatile memory, processors such as microprocessors and digital signal processors, computational entities such as operating systems, drivers, graphical user interfaces, and applications programs, one or more interaction devices, such as a touch pad or screen, and/or control systems including feedback loops and control motors (e.g., feedback for sensing position and/or velocity of gantry systems; control motors for moving and/or adjusting components and/or quantities).

A typical data processing system may be implemented utilizing any suitable commercially available components, such as those typically found in data computing/communication and/or network computing/communication systems. The herein described subject matter sometimes illustrates different components contained within, or connected with, different other components. It is to be understood that such depicted architectures are merely exemplary, and that in fact many other architectures may be implemented which achieve the same functionality. In a conceptual sense, any arrangement of components to achieve the same functionality is effectively "associated" such that the desired functionality is achieved. Hence, any two components herein combined to achieve a particular functionality may be seen as "associated with" each other such that the desired functionality is achieved, irrespective of architectures or intermediate components. Likewise, any two components so associated may also be viewed as being "operably connected", or "operably coupled", to each other to achieve the desired functionality, and any two components capable of being so associated may also be viewed as being "operably couplable", to each other to achieve the desired functionality. Specific examples of operably couplable include but are not limited to physically connectable and/or physically interacting components and/or wirelessly interactable and/or wirelessly interacting components and/or logically interacting and/or logically interactable components.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations).

Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

In addition, where features or aspects of the disclosure are described in terms of Markush groups, those skilled in the art will recognize that the disclosure is also thereby described in terms of any individual member or subgroup of members of the Markush group.

As will be understood by one skilled in the art, for any and all purposes, such as in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art all language such as "up to," "at least," "greater than," "less than," and the like include the number recited and refer to ranges which can be subsequently broken down into subranges as discussed above. Finally, as will be understood by one skilled in the art, a range includes each individual member. Thus, for example, a group having 1-3 cells refers to groups having 1, 2, or 3 cells. Similarly, a group having 1-5 cells refers to groups having 1, 2, 3, 4, or 5 cells, and so forth.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

What is claimed is:

1. A filter device, comprising:
   a first substrate formed by a first polymerization of a liquid monomer composition;
   a second substrate formed by a second polymerization of the liquid monomer composition, wherein the second substrate is positioned substantially parallel and opposite to the first substrate; and
   an array of parallel nanotubes,
      wherein each nanotube of the array of the parallel nanotubes is composed from a graphene membrane that has discrete pores selective for passage of one or more molecules through the discrete pores,
      wherein the array of the parallel nanotubes extends between the first substrate and the second substrate such that the array of the parallel nanotubes is substantially perpendicular to the first substrate and the second substrate,
      wherein each nanotube of the array of the parallel nanotubes has a first opening embedded in the first substrate and a second opening embedded in the second substrate such that a fluid mixture is provided into one of the first opening and the second opening, and
      wherein the fluid mixture includes at least a first molecule and a second molecule such that one of the first molecule and the second molecule is filtered through the discrete pores.

2. The filter device of claim 1, wherein each nanotube of the array of the parallel nanotubes includes a single-walled carbon nanotube.

3. The filter device of claim 1, wherein the fluid mixture includes one of a gas mixture, a liquid mixture, and a supercritical mixture.

4. The filter device of claim 1, wherein the discrete pores of the graphene membrane have a size selective for passage of one or more gas molecules across the graphene membrane.

5. The filter device of claim 1, wherein the liquid monomer composition includes one or more of: an epoxy monomer, a urethane monomer, a cyanoacrylate monomer, a siloxane monomer, and an acrylic monomer.

6. The filter device of claim 1, wherein the array of the parallel nanotubes is arranged such that the fluid mixture is exposed to the first opening of the nanotubes in the first substrate, filtered through walls of the nanotubes as the fluid mixture passes through the nanotubes, and the filtered fluid mixture is collected at the second opening in the second substrate.

7. The filter device of claim 1, wherein the array of the parallel nanotubes is arranged such that the fluid mixture is exposed to the first opening in the first substrate, wherein walls of the nanotubes filter the fluid mixture as the fluid mixture passes through the nanotubes, and wherein a space that surrounds the array of the parallel nanotubes between the first substrate and the second substrate collects the filtered fluid mixture.

8. The filter device of claim 1, wherein the nanotubes have diameters in a range between about 1 nanometer to about 1 micrometer.

9. The filter device of claim 1, wherein the nanotubes have an approximate length in a range between about 0.1 millimeters to about 30 millimeters.

10. The filter device of claim 1, wherein the array of the parallel nanotubes has an areal density percentage at one of the first substrate and the second substrate in a range of from about 0.01% to about 90%.

11. A system to form a filter device with an array of parallel nanotubes, the system comprising:
   a nanotube growth chamber;
   a sample manipulator configured to hold a growth substrate in the nanotube growth chamber;
   a catalyst depositor configured to deposit a nanoparticulate catalyst;
   a gas source configured to deliver gas to the nanotube growth chamber;
   a heater configured to heat the nanotube growth chamber;
   a monomer source operatively coy pled to the sample manipulator;
   a polymerization initiator;

a microtome;
a pore formation apparatus; and
a controller configured by machine exec instructions, the controller coupled with the nanotube growth chamber, the sample manipulator, the catalyst depositor, the gas source, the heater, the monomer source, the polymerization initiator, the microtome, and the pore formation apparatus, wherein the controller is operable to:
configure the sample manipulator to hold the growth substrate;
configure the catalyst depositor to deposit the nanoparticulate catalyst on the growth substrate;
configure the gas source to expose a nanotube feedstock gas to the nanoparticulate catalyst deposited on the growth substrate;
configure the heater to heat the nanotube growth chamber such that the array of the parallel nanotubes grows from the nanoparticulate catalyst deposited on the growth substrate, wherein each nanotube of the array of the parallel nanotubes is composed from a graphene membrane;
configure the monomer source to perform a first process to embed a first end of the array of the parallel nanotubes in a liquid monomer composition and perform a second process to embed a second end of the array of the parallel nanotubes in the liquid monomer composition;
configure the polymerization initiator to:
perform a first polymerization of the liquid monomer composition to form a first substrate at the first end of the array of the parallel nanotubes, and
perform a second polymerization of the liquid monomer composition to form a second substrate at the second end of the array of the parallel nanotubes, wherein the second substrate is positioned in a substantially parallel and opposite position to the first substrate;
configure the sample manipulator to remove the growth substrate;
configure the microtome to cut the liquid monomer composition that forms the first substrate and the second substrate such that a first opening of each nanotube in the array of the parallel nanotubes is exposed at a first outer surface of the first substrate and a second opening of each nanotube is exposed at a second outer surface of the second substrate,
wherein the first opening is embedded in the first substrate and the second opening is embedded in the second substrate such that a fluid mixture is provided into one of the first opening and the second opening, and
wherein the array of the parallel nanotubes extends between the first substrate and the second substrate such that the array of the parallel nanotubes is substantially perpendicular to the first substrate and the second substrate; and
configure the pore formation apparatus to form discrete pores in the graphene membrane of each nanotube in the array of the parallel nanotubes, wherein the fluid mixture includes at least a first molecule and a second molecule such that one of the first molecule and the second molecule is filtered through the discrete pores.

12. The system of claim 11, wherein growth of the array of the parallel nanotubes is initiated by an employment of one or more of chemical vapor deposition, radio frequency magnetron sputtering, oxidation, thermal evaporation and remote plasma chemical vapor deposition.

13. The system of claim 11, wherein the liquid monomer composition includes one or more of: an epoxy monomer, a urethane monomer, a cyanoacrylate monomer, a siloxane monomer, and an acrylic monomer.

14. The system of claim 11, wherein one or more carbon atoms are removed from locations within each of the nanotubes in the array of the parallel nanotubes to cause carbon vacancy defects in each of the nanotubes.

15. The system of claim 11, wherein the discrete pores in each nanotube of the array of the parallel nanotubes are formed by employment of one or more of: atomic oxygen etching, electron beam etching, and selective chemical etching.

16. A method to filter a fluid mixture by use of a filter device, the method comprising:
exposing the fluid mixture to a first end of an array of parallel nanotubes embedded in a first substrate,
wherein the first substrate is formed by a first polymerization of a liquid monomer composition,
wherein each nanotube of the array of the parallel nanotubes is composed from a graphene member that has discrete pores, and
wherein the fluid mixture comprises at least a first molecular species and a second molecular species;
directing the first molecular species through the discrete pores of the graphene member located in each nanotube in the array of the parallel nanotubes to form a filtrate fraction that includes at least a portion of the first molecular species through one or more of a temperature, pressure, concentration, polarity, and electrochemical potential gradient across walls of the array of the parallel nanotubes;
collecting the filtrate fraction that includes the first molecular species in a space that surrounds the array of the parallel nanotubes between the first substrate and a second substrate,
wherein a second end of the array of the parallel nanotubes is embedded in the second substrate,
wherein the second substrate is formed by a second polymerization of the liquid monomer composition, and
wherein the second substrate is positioned in a substantially parallel and opposite orientation to the first substrate;
retaining the second molecular species within the array of the parallel nanotubes to form a retentate fraction that includes at least a portion of the second molecular species, wherein the array of the parallel nanotubes extends between the first substrate and the second substrate such that the array of the parallel nanotubes is substantially perpendicular to the first substrate and the second substrate; and
collecting the retentate fraction at the second end of the array of the parallel nanotubes embedded in the second substrate.

17. The method of claim 16, wherein exposing the fluid mixture to the first end of the array of the parallel nanotubes comprises:
exposing one of: a gas mixture, a liquid mixture, and a supercritical mixture to the first end of the array of the parallel nanotubes.

18. The method of claim 16, further comprising:
directing the first molecular species through the discrete pores located in each nanotube by employment of a gradient across walls of the array of the parallel nanotubes.

19. The method of claim 16, wherein:
- exposing the fluid mixture includes exposing the fluid mixture along an external surface of the array of the parallel nanotubes in a space that surrounds the array of the parallel nanotubes between the first substrate and the second substrate;
- directing the first molecular species through the discrete pores includes directing the first molecular species through the discrete pores located in each nanotube of the array of the parallel nanotubes such that the filtrate fraction that includes the first molecular species is formed within each nanotube of the array of the parallel nanotubes; and
- wherein collecting the filtrate fraction includes collecting the filtrate fraction that includes the first molecular species at one of a first opening and a second opening on one of the first end of the array of the parallel nanotubes and the second end of the array of the parallel nanotubes.

20. The method of claim 16, wherein directing the first molecular species through the discrete pores located in each nanotube in the array of the parallel nanotubes comprises:
- directing a gas molecule through the discrete pores that has a size selective for passage of the gas molecule across each nanotube in the array of the parallel nanotubes.

* * * * *

UNITED STATES PATENT AND TRADEMARK OFFICE
CERTIFICATE OF CORRECTION

| | | |
|---|---|---|
| PATENT NO. | : 9,278,318 B2 | Page 1 of 1 |
| APPLICATION NO. | : 13/995339 | |
| DATED | : March 8, 2016 | |
| INVENTOR(S) | : Anderson et al. | |

It is certified that error appears in the above-identified patent and that said Letters Patent is hereby corrected as shown below:

Specification

In Column 1, below Title, insert -- CROSS-REFERENCE TO RELATED APPLICATIONS --.

In Column 1, Line 5, delete "§371" and insert -- § 371 --, therefor.

In Column 11, Line 63, delete "nanoparticies." and insert -- nanoparticles. --, therefor.

In Column 12, Line 37, delete "1C™ M" and insert -- 1C™ --, therefor.

Claims

In Column 24, Line 65, in Claim 11, delete "coy pled" and insert -- coupled --, therefor.

In Column 25, Line 3, in Claim 11, delete "exec" and insert -- executable --, therefor.

Signed and Sealed this
Nineteenth Day of July, 2016

Michelle K. Lee
*Director of the United States Patent and Trademark Office*